(12) United States Patent
Kim et al.

(10) Patent No.: US 9,960,220 B2
(45) Date of Patent: *May 1, 2018

(54) ORGANIC LIGHT EMITTING DIODE DISPLAY

(71) Applicant: Samsung Display Co., Ltd., Yongin, Gyeonggi-Do (KR)

(72) Inventors: Tae-Woong Kim, Yongin (KR); Hyun-Woo Koo, Yongin (KR); Young-Gug Seol, Yongin (KR); Young-Ki Hong, Yongin (KR); Won-Kyu Kwak, Yongin (KR); Yang-Wan Kim, Yongin (KR); Han-Sung Bae, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days. days.

This patent is subject to a terminal disclaimer.

(21) Appl. No.: 15/413,195

(22) Filed: Jan. 23, 2017

(65) Prior Publication Data

US 2017/0133448 A1 May 11, 2017

Related U.S. Application Data

(63) Continuation of application No. 14/032,907, filed on Sep. 20, 2013, now Pat. No. 9,553,136.

(30) Foreign Application Priority Data

Sep. 28, 2012 (KR) .......................... 10-2012-0109447

(51) Int. Cl.
*H01L 27/32* (2006.01)
*H01L 51/00* (2006.01)

(52) U.S. Cl.
CPC ...... *H01L 27/3262* (2013.01); *H01L 27/3248* (2013.01); *H01L 27/3276* (2013.01); *H01L 51/0097* (2013.01)

(58) Field of Classification Search
CPC .................................... H01L 27/3241–27/329
(Continued)

(56) References Cited

U.S. PATENT DOCUMENTS 7,002,186 B2 2/2006 Kang et al.
8,237,165 B2 8/2012 Kim et al.
(Continued)

FOREIGN PATENT DOCUMENTS

JP 2011027822 2/2011
KR 1020060000846 1/2006
(Continued)

OTHER PUBLICATIONS

P. I. Hsu et al., Spherical deformation of compliant substrates with semiconductor device islands, Journal of Applied Physics, vol. 95, No. 2, Jan. 15, 2004, p. 705-712. (Cited in Information Disclosure Statement filed on Sep. 23, 2013 by Applicant.)

*Primary Examiner* — Daniel Shook
(74) *Attorney, Agent, or Firm* — H.C. Park & Associates, PLC

(57) ABSTRACT

An organic light emitting diode (OLED) display, including a flexible substrate bent in a first direction, an OLED arranged on the flexible substrate, a first thin film transistor connected to the OLED and including a first channel area extending in a second direction crossing the first direction, and one or more additional thin film transistors connected to the first thin film transistor and including corresponding additional channel areas extending in the second direction.

11 Claims, 6 Drawing Sheets

(58) Field of Classification Search
USPC .............................................. 257/40; 438/99
See application file for complete search history.

(56) References Cited

U.S. PATENT DOCUMENTS

| | | |
|---|---|---|
| 9,553,136 B2 * | 1/2017 | Kim .................... H01L 27/3262 |
| 2005/0285134 A1 | 12/2005 | Kang et al. |
| 2007/0018170 A1 | 1/2007 | Jeong et al. |
| 2009/0108263 A1 | 4/2009 | Yamazaki |
| 2009/0191670 A1 | 7/2009 | Heitzinger et al. |
| 2009/0200613 A1 | 8/2009 | Uemura et al. |
| 2013/0207117 A1 | 8/2013 | An et al. |

FOREIGN PATENT DOCUMENTS

| | | |
|---|---|---|
| KR | 1020090086329 | 8/2009 |
| KR | 101155907 | 6/2012 |

\* cited by examiner

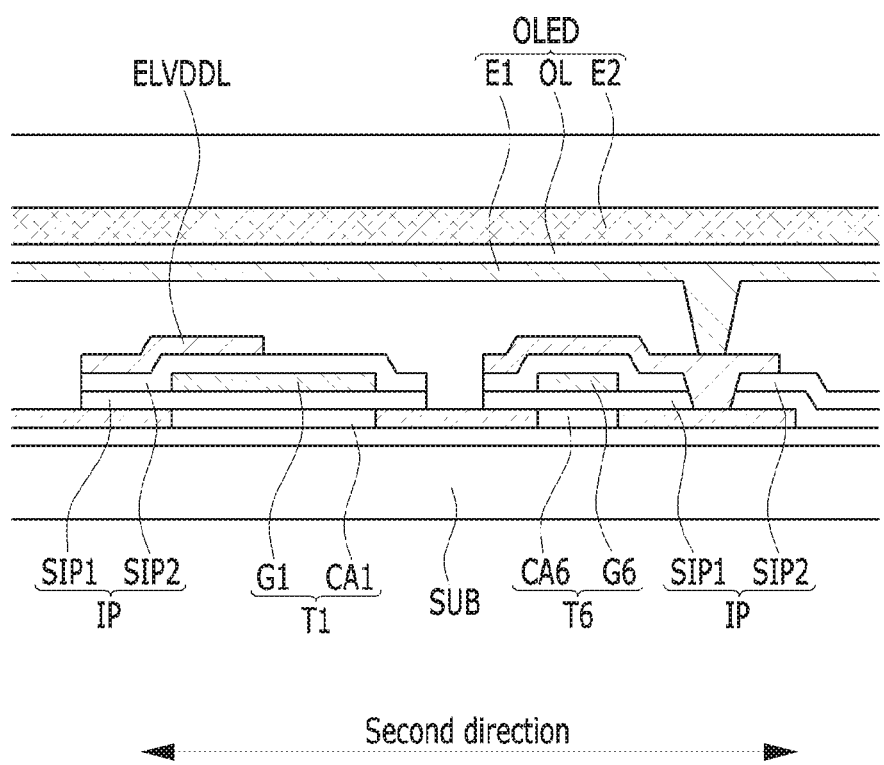

ORGANIC LIGHT EMITTING DIODE DISPLAY

CLAIM OF PRIORITY

This application is filed under 35 U.S.C § 120 as a continuation of U.S. patent application Ser. No. 14/032,907, filed on 20 Sep. 2013, which claims priority under 35 U.S.C § 119 to and the benefit of Korean Patent Application No. 10-2012-0109447 filed in the Korean Intellectual Property Office on 28 Sep. 2012, the entire contents of which are incorporated herein by reference.

BACKGROUND OF THE INVENTION

Field of the Invention

The described technology relates generally to an organic light emitting diode display including a flexible substrate.

Description of the Related Art

A display device is a device displaying images, and recently, a display device including an organic light emitting diode has received attention. Since the organic light emitting diode display has a self-emission characteristic and, unlike a liquid crystal display device, does not require a separate light source, a thickness and a weight of the entire display device may be reduced. Further, the organic light emitting diode display has high-definition characteristics such as low power consumption, high luminance, and a high response speed.

In general, the organic light emitting diode display includes a substrate, a plurality of thin film transistors arranged on the substrate, and an organic light emitting diode connected to the thin film transistor. Recently, a flexible organic light emitting diode display including a flexible substrate containing a polymer material as a substrate capable of being bent has been developed.

The above information disclosed in this Background section is only for enhancement of understanding of the background of the described technology, and therefore it may contain information that does not constitute prior art under 35 U.S.C. §102.

SUMMARY OF THE INVENTION

The described technology has been made in an effort to provide an organic light emitting diode display having advantages of minimizing deterioration of electric characteristics of a thin film transistor, even while including a flexible substrate.

According to one aspect of the present invention, there is provided an organic light emitting diode (OLED) display that includes flexible substrate bent in a first direction, an organic light emitting diode arranged on the flexible substrate, first thin film transistor connected to the organic light emitting diode and including a first channel area extending in a second direction that crosses the first direction and at least one additional thin film transistor connected to the first thin film transistor and including a corresponding at least one additional channel area extending in the second direction. The second direction may be orthogonal to the first direction. The flexible substrate may be made out of polyimide. The flexible substrate may have a rectangular shape, and the first direction may be a parallel direction to a long side of the flexible substrate. The OLED display may also include a plurality of insulation patterns covering the first channel area and the at least one additional channel area, respectively. The OLED display may also include a first inorganic insulating layer covering the first channel area and each of the at least one additional channel area and a second inorganic insulating layer arranged on the first inorganic insulating layer.

The organic light emitting diode may include a first electrode that is connected to the first thin film transistor, an organic emission layer may be arranged on the first electrode and a second electrode may be arranged on the organic emission layer. Each of the insulation patterns may have an island shape. The first thin film transistor may also include a first gate electrode arranged on the first channel area, wherein the insulation patterns may include a first sub-insulation pattern arranged between the first gate electrode and the first channel area and a second sub-insulation pattern arranged on the first gate electrode. The OLED display may also include a first organic insulation layer covering the first channel area and the at least one additional channel area. The OLED display may also include a second organic insulation layer covering the first gate electrode, wherein the first thin film transistor further includes a first gate electrode arranged on the first channel area, the first organic insulation layer may be interposed between the first gate electrode and the first channel area. Each of the first thin film transistor and the additional thin film transistors may include a gate electrode arranged over a channel area, the first inorganic insulating layer may be interposed between the gate electrode and the channel area of each of the first and additional thin film transistors.

The OLED display may also include a first scan line extending in the second direction on the flexible substrate, a second scan line spaced apart from the first scan line and extending in the second direction, an initial power supply line spaced apart from the second scan line and extending in the second direction, a light emission control line spaced apart from the initial power supply line and extending in the second direction, a data line extending in the first direction on the flexible substrate and a driving power supply line spaced apart from the data line and extending in the first direction.

The at least one additional thin film transistor may include a plurality of additional thin film transistors, the first thin film transistor may also include a first gate electrode arranged on the first channel area, the plurality of additional thin film transistors may include a second thin film transistor including a second gate electrode connected to the first scan line and a second channel area connecting the data line to the first thin film transistor and extending in the second direction, a third thin film transistor including a third gate electrode connected to the first scan line and a third channel area connecting the first thin film transistor to the first gate electrode of the first thin film transistor and extending in the second direction, a fourth thin film transistor including a fourth gate electrode connected to the second scan line and a fourth channel area connecting the initial power supply line to the first gate electrode and extending in the second direction, a fifth thin film transistor including a fifth gate electrode connected to the light emission control line and a fifth channel area connecting the driving power supply line to the first thin film transistor and extending in the second direction and a sixth thin film transistor including a sixth gate electrode connected to the light emission control line and a sixth channel area connecting the first thin film transistor to the organic light emitting diode and extending in the second direction.

The first direction may correspond to a longitudinal direction of the flexible substrate, wherein when the flexible substrate is bent in the first direction, a bending line extends along the second direction of the flexible substrate and along a widthwise direction of each of the first channel area and the at least one additional channel areas. The second direction may be orthogonal to the first direction.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 6 is a cross-sectional view of FIG. 5 taken along line VI-VI.

DETAILED DESCRIPTION OF THE INVENTION

Figure 1:
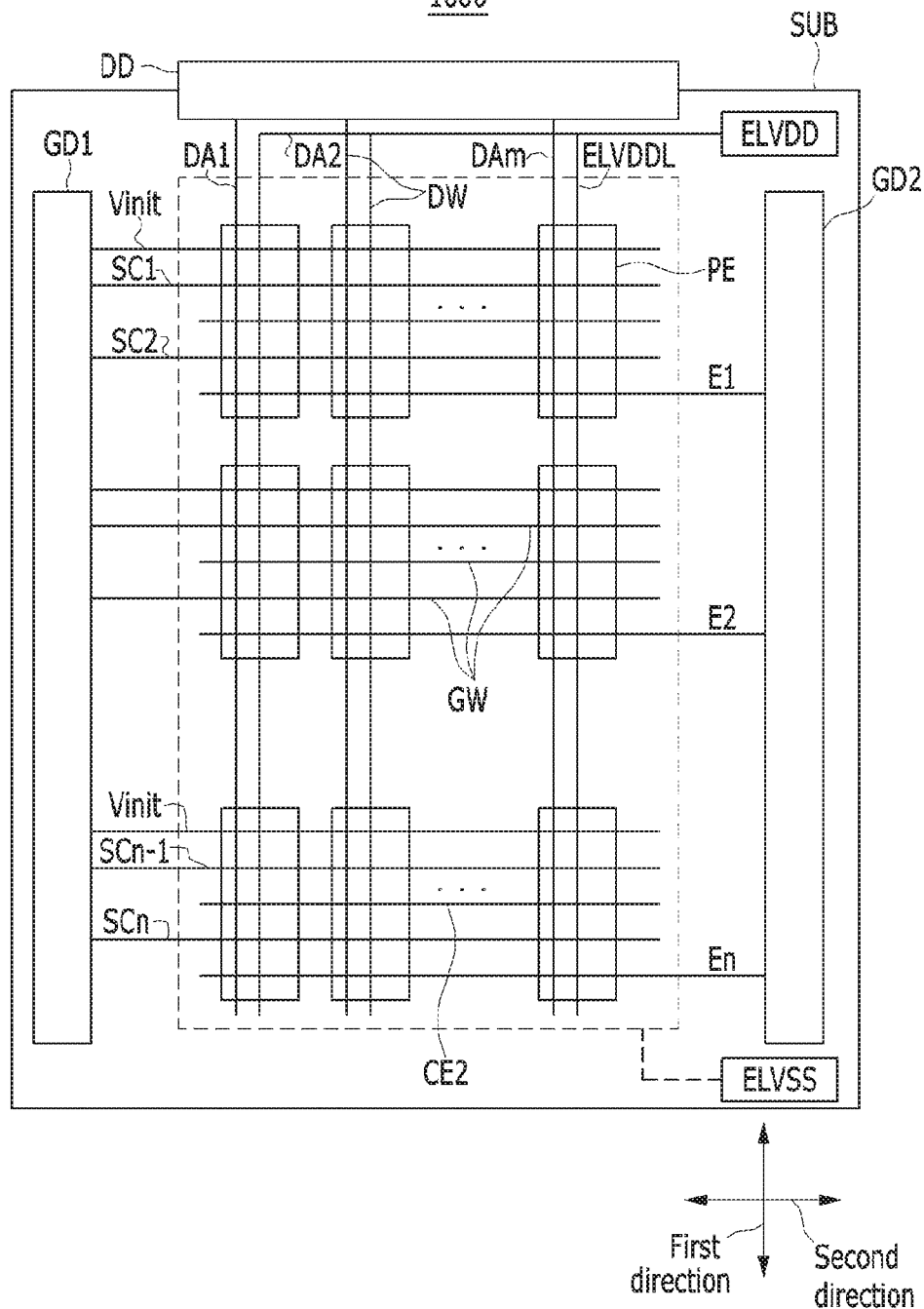
FIG. 1 is a diagram illustrating an organic light emitting diode display according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, in exemplary embodiments, since like reference numerals designate like elements having the same configuration, a first exemplary embodiment is representatively described, and in other exemplary embodiments, only a configuration different from the first exemplary embodiment will be described.

In addition, the size and thickness of each configuration shown in the drawings are arbitrarily shown for understanding and ease of description, but the present invention is not limited thereto.

In the drawings, the thickness of layers, films, panels, regions, etc., are exaggerated for clarity. In addition, in the drawing, for convenience of description, the thickness of some of layers, films, panels, regions, etc., are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below the object portion, but does not essentially mean positioning on the upper side of the object portion based on a gravity direction.

Hereinafter, an organic light emitting diode display according to a first exemplary embodiment will be described with reference to FIGS. 1 to 3. Turning now to FIG. 1, FIG. 1 is a diagram illustrating an organic light emitting diode display according to a first exemplary embodiment.

As illustrated in FIG. 1, an organic light emitting diode display 1000 according to the first exemplary embodiment includes a flexible substrate SUB, a gate driver GD1, a gate wires GW, a light emission control driver GD2, a data driver DD, a data wires DW, and a pixel PE. The flexible substrate SUB has a two-dimensionally rectangular shape and may be bent in a first direction which is a parallel direction to a long side of the flexible substrate SUB. The flexible substrate SUB may contain one or more of a polymer material such as polyimide, a metal material, and an inorganic material, but is not limited thereto and may contain any material as long as the flexible substrate SUB may be bent. The flexible substrate SUB may have a film shape.

The flexible substrate SUB of the organic light emitting diode display 1000 according to the first exemplary embodiment has a rectangular shape, but a flexible substrate of an organic light emitting diode display according to a variation of the first embodiment may alternatively have any two-dimensional shape, such as a circle, a triangle, an oval, and a polygon, as long as the flexible substrate may be bent in the first direction.

The gate driver GD1 sequentially supplies scan signals to first scan lines SC1-SCn−1 and second scan lines SC2-SCn which are included in the gate wires GW in response to control signals supplied from an external control circuit (not illustrated), for example, a timing controller and the like, respectively. Then, the pixel PE is selected by the scan signal to sequentially receive data signals. Here, the pixel PE may mean a minimum unit displaying an image.

The gate wires GW are arranged on the flexible substrate SUB and extend in a second direction crossing the first direction. The gate wires GW include a first scan line SCn−1, light emission control lines E1-En, a second scan line SCn, an initial power supply line Vinit, and a second capacitor electrode CE2 to be described below. The first scan line SCn−1 is connected to the gate driver GD1 and receives the scan signal from the gate driver GD1. The light emission control line En is connected to the light emission control driver GD2 and receives a light emission control signal from the light emission control driver GD2. The second scan line SCn is connected to the gate driver GD1 and receives the scan signal from the gate driver GD1. The initial power supply line Vinit is connected to the gate driver GD1 and receives an initial power supply from the gate driver GD1. The second capacitor electrode CE2 is spaced apart from the first scan line SCn−1 and extends in the second direction.

As such, the initial power supply line Vinit, the first scan line SCn−1, the second capacitor electrode CE2, the second scan line SCn, and the light emission control line En are spaced apart from each other and extend in the second direction, respectively. Further, the initial power supply line Vinit, the first scan line SCn−1, the second capacitor electrode CE2, the second scan line SCn, and the light emission control line En are arranged on the same layer and are made out of a same material, respectively and may be formed through a single process such as photolithography.

In the first exemplary embodiment, the initial power supply line Vinit receives the initial power supply from the gate driver GD1, but in another exemplary embodiment, the initial power supply line Vinit is connected to another additional element to receive the initial power supply from another additional element.

The light emission control driver GD2 sequentially supplies light emission control signals to the light emission control line En in response to a control signal supplied from the outside, such as the timing controller. Then, light emission of the pixel PE is controlled by the light emission control signal.

That is, the light emission control signal controls a light emission time of the pixel PE. However, the light emission control driver GD2 may be omitted according to an internal structure of the pixel PE.

The data driver DD supplies a data signal to the data line DAm among the data wires DW in response to the control signal supplied from the outside such as the timing controller. The data signal supplied to the data line DAm is supplied to the pixel PE selected by the scan signal whenever the scan signal is supplied to the second scan line SCn. Then, the pixel PE charges voltage corresponding to the data signal and emits light having a luminance corresponding to the voltage.

The data wires DW are arranged on the gate wires GW and extend in the first direction crossing the second direction. The data wires DW include data lines DA1-DAm and a driving power supply line ELVDDL. The data line Dam is connected to the data driver DD and receives the data signal from the data driver DD. The driving power supply line ELVDDL is connected to a first external power supply ELVDD to be described below and receives a driving power supply from the first power supply ELVDD.

The pixel PE is arranged at a crossing region of the gate wires GW and the data wires DW, and includes an organic light emitting diode emitting light at a luminance in response to driving current corresponding to the data signal. The pixel PE also includes a plurality of thin film transistors for controlling driving current flowing in the organic light emitting diode, and one or more capacitors. The plurality of thin film transistors and one or more capacitors are connected to the gate wires GW and the data wires DW, respectively, and the organic light emitting diode is connected to the plurality of thin film transistors and one or more capacitors. The organic light emitting diode is connected between the first power supply ELVDD and the second power supply ELVSS.

Figure 2:
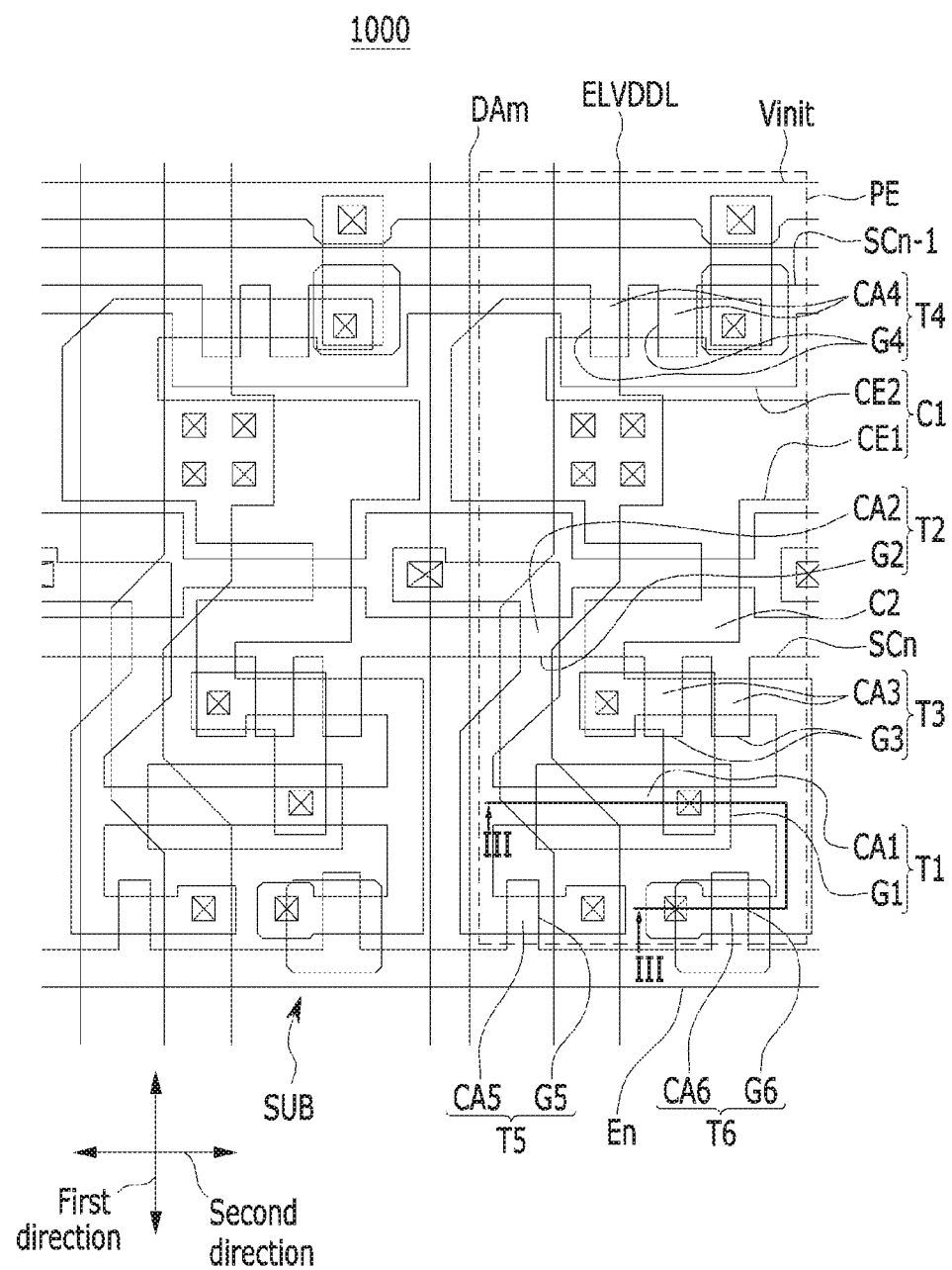
FIG. 2 is a layout view illustrating a pixel part illustrated in FIG. 1.
Figure 3:
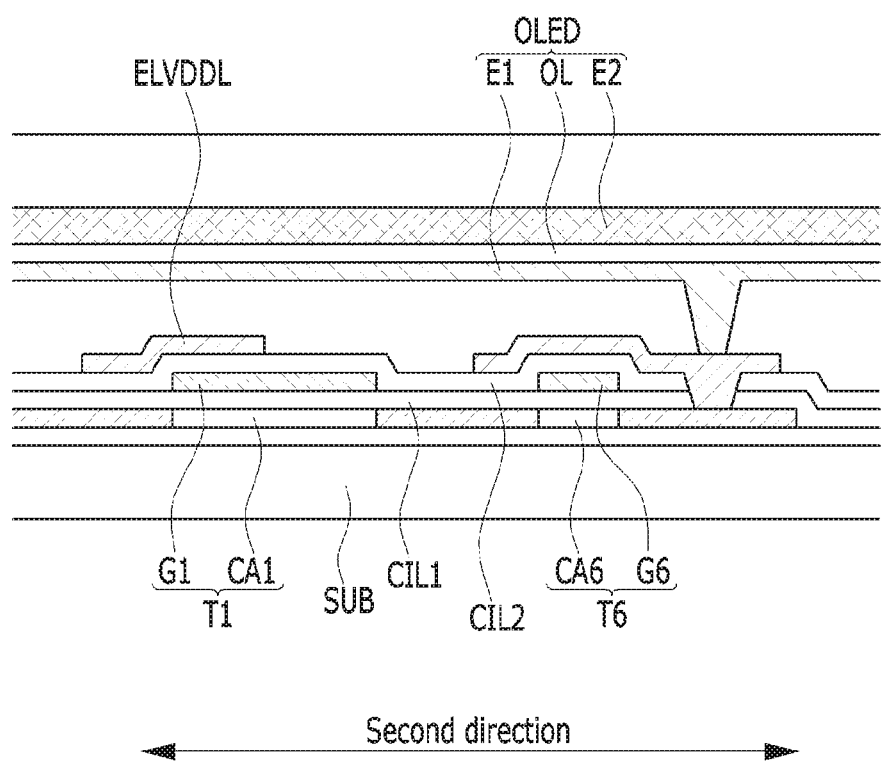
FIG. 3 is a cross-sectional view of FIG. 2 taken along line III-III.

FIG. 2 is a layout view illustrating a pixel part illustrated in FIG. 1. FIG. 3 is a cross-sectional view of FIG. 2 taken along line III-III. As illustrated in FIGS. 2 and 3, the pixel PE includes two capacitors, an organic light emitting diode OLED connected between the first power supply ELVDD and the second power supply ELVSS, and a pixel circuit including six thin film transistors connected between the organic light emitting diode OLED and the first power supply ELVDD to control the driving power supply supplied to the organic light emitting diode OLED.

The organic light emitting diode OLED includes a first electrode E1, an organic emission layer OL arranged on the first electrode E1, and a second electrode E2 arranged on the organic emission layer OL. The first electrode E1, which is an anode of the organic light emitting diode OLED, is connected to the driving power supply line ELVDDL connected to the first power supply ELVDD through the pixel circuit. The second electrode E2, which is a cathode of the organic light emitting diode OLED, is connected to the second power supply ELVSS. The organic emission layer OL of the organic light emitting diode OLED emits light at a luminance corresponding to the driving current flowing in the organic light emitting diode OLED when the driving power supply is supplied from the first power supply ELVDD through the pixel circuit and a common power supply is supplied from the second power supply ELVSS. The organic emission layer OL contains light emitting materials of red, blue, green, white or the like, or may be formed by laminating a plurality of emission layers emitting light of red, blue, green, white or the like.

The pixel circuit includes a first thin film transistor T1, a second thin film transistor T2, a third thin film transistor T3, a fourth thin film transistor T4, a fifth thin film transistor T5, and a sixth thin film transistor T6 which are one or more other thin film transistors, a first capacitor C1, and a second capacitor C2.

The first thin film transistor T1 is connected between the driving power supply line ELVDDL and the first electrode E1 of the organic light emitting diode OLED and supplies the driving power supply corresponding to the data signal for a light emission period of the pixel PE from the first power supply ELVDD to the organic light emitting diode OLED. That is, the first thin film transistor T1 functions as a driving transistor of the pixel PE. The first gate electrode G1 of the first thin film transistor T1 is connected to the first capacitor electrode CE1 of the first capacitor C1, the second capacitor C2, the third thin film transistor T3, and the fourth thin film transistor T4 respectively, the source electrode is connected to the second thin film transistor T2 and the fifth thin film transistor T5, respectively, and the drain electrode is connected to the third thin film transistor T3 and the sixth thin film transistor T6, respectively. The first electrode E1 of the organic light emitting diode OLED is connected to the first thin film transistor T1 through the sixth thin film transistor T6.

The first thin film transistor T1 is arranged between the source electrode and the drain electrode to connect the driving power supply line ELVDDL and the first electrode E1 of the organic light emitting diode OLED and includes a first channel area CA1 arranged to correspond to the first gate electrode G1 with a first inorganic insulation layer CIL1 therebetween. The first channel area CA1 may be made of amorphous silicon (a-Si), poly silicon, oxide semiconductor, and the like. The first channel area CA1 is arranged on the same layer as a second channel area CA2, a third channel area CA3, a fourth channel area CA4, a fifth channel area CA5, and a sixth channel area CA6 to be described below. That is, the first channel area CA1, the second channel area CA2, the third channel area CA3, the fourth channel area CA4, the fifth channel area CA5, and the sixth channel area CA6 may be formed by using one process such as a chemical vapor deposition process. The first channel area CA1 extends in a second direction crossing the first direction, which is the bending direction of the flexible substrate SUB. As such, the first channel area CA1 extends in the second direction, and as a result, when the flexible substrate SUB is bent in the first direction, the first channel area CA1 is not bent in the extending direction.

The first gate electrode G1 of the first thin film transistor T1 is covered by the second inorganic insulation layer CIL2. The first inorganic insulation layer CIL1 is arranged between the first gate electrode G1 and the first channel area CA1 and contains an inorganic material such as silicon nitride or silicon oxide. The second inorganic insulation layer CIL2 covers the first gate electrode G1 and contains an inorganic material such as silicon nitride or silicon oxide.

The second thin film transistor T2 connects the data line DAm to the first thin film transistor T1 and includes the second gate electrode G2 connected to the second scan line SCn. The second thin film transistor T2 transfers the data signal supplied by the data line DAm to the inside of the pixel PE when the scan signal is supplied from the second scan line SCn. That is, the second thin film transistor T2 functions as a switching transistor of the pixel PE.

The second thin film transistor T2 is arranged between the source electrode and the drain electrode to connect the data line DAm and the first thin film transistor T1. The second thin film transistor T2 includes the second channel area CA2 arranged to correspond to the second gate electrode G2 with the first inorganic insulation layer CIL1 therebetween.

The second channel area CA2 extends in the second direction crossing the first direction which is a bending direction of the flexible substrate SUB. As such, the second channel area CA2 extends in the second direction, and as a result, when the flexible substrate SUB is bent in the first direction, the second channel area CA2 is not bent in the extending direction.

The third thin film transistor T3 connects the first thin film transistor T1 to the first gate electrode G1 and includes the third gate electrode G3 connected to the second scan line SCn. The third thin film transistor T3 diode connects the first thin film transistor T1 when the data signal is supplied to the inside of the pixel PE to compensate threshold voltage of the first thin film transistor T1. That is, the third thin film transistor T3 functions as a compensation transistor of the pixel PE.

The third thin film transistor T3 is arranged between the source electrode and the drain electrode to connect the first thin film transistor T1 to the first gate electrode G1, and includes the third channel area CA3 arranged to correspond to the third gate electrode G3 with the first inorganic insulation layer CIL1 therebetween.

The third channel area CA3 extends in the second direction crossing the first direction which is a bending direction of the flexible substrate SUB. As such, the third channel area CA3 extends in the second direction, and as a result, when the flexible substrate SUB is bent in the first direction, the third channel area CA3 is not bent in the extending direction.

The fourth thin film transistor T4 connects the initial power supply line Vinit to the first gate electrode G1 of the first thin film transistor T1, and includes the fourth gate electrode G4 connected to the first scan line SCn−1. The fourth thin film transistor T4 transfers the initial power supply voltage supplied from the initial power supply line Vinit upon the scan signal being supplied by the first scan line SCn−1 during an initialization period and before a data programming period, so that the data signal may be supplied to the inside of the pixel PE for the data programming period in which the data signal is inputted to the pixel PE to initialize the first thin film transistor T1. That is, the fourth thin film transistor T4 functions as a switching transistor of the pixel PE.

The fourth thin film transistor T4 is arranged between the source electrode and the drain electrode to connect the initial power supply line Vinit and the first gate electrode G1 of the first thin film transistor T1 and includes the fourth channel area CA4 arranged to correspond to the fourth gate electrode G4 with the first inorganic insulation layer CIL1 therebetween.

The fourth channel area CA4 extends in the second direction crossing the first direction which is a bending direction of the flexible substrate SUB. As such, the fourth channel area CA4 extends in the second direction, and as a result, when the flexible substrate SUB is bent in the first direction, the fourth channel area CA4 is not bent in the extending direction.

The fifth thin film transistor T5 connects the driving power supply line ELVDDL and the first thin film transistor T1 and includes the fifth gate electrode G5 connected to the light emission control line En. The fifth thin film transistor T5 interrupts connection between the driving power supply line ELVDDL, which is connected to the first power supply ELVDD for a non-light emission period of the pixel PE, and the first thin film transistor T1, and connects the driving power supply line ELVDDL to the first thin film transistor T1 during the light emission period of the pixel PE. That is, the fifth thin film transistor T5 functions as a switching transistor of the pixel PE.

The fifth thin film transistor T5 is arranged between the source electrode and the drain electrode to connect the driving power supply line ELVDDL to the first thin film transistor T1 and includes the fifth channel area CA5 arranged to correspond to the fifth gate electrode G5, with the first inorganic insulation layer CIL1 therebetween.

The fifth channel area CA5 extends in the second direction crossing the first direction, which is a bending direction of the flexible substrate SUB. As such, the fifth channel area CA5 extends in the second direction, and as a result, when the flexible substrate SUB is bent in the first direction, the fifth channel area CA5 is not bent in the extending direction.

The sixth thin film transistor T6 connects the first thin film transistor T1 and the first electrode E1 of the organic light emitting diode OLED, and includes the sixth gate electrode G6 connected to the light emission control line En. The sixth thin film transistor T6 interrupts connection between the first thin film transistor T1 and the organic light emitting diode OLED during the non-light emitting period of the pixel PE, and connects the first thin film transistor T1 to the organic light emitting diode OLED during the light emission period of the pixel PE. That is, the sixth thin film transistor T6 functions as a switching transistor of the pixel PE.

The sixth thin film transistor T6 is arranged between the source electrode and the drain electrode to connect the first thin film transistor T1 to the first electrode E1 of the organic light emitting diode OLED and includes the sixth channel area CA6 arranged to correspond to the sixth gate electrode G6 with the first inorganic insulation layer CIL1 therebetween.

The sixth channel area CA6 extends in the second direction crossing the first direction which is a bending direction of the flexible substrate SUB. As such, the sixth channel area CA6 extends in the second direction, and as a result, when the flexible substrate SUB is bent in the first direction, the sixth channel area CA6 is not bent in the extending direction.

The first electrode E1 is connected to the drain electrode of the sixth thin film transistor T6 through the first inorganic insulation layer CIL1 and the second inorganic insulation layer CIL2.

Meanwhile, the gate driver GD1, the light emission control driver GD2, and the data driver DD may include a plurality of thin film transistors, respectively, and the channel areas of the thin film transistors which are included in the gate driver GD1, the light emission control driver GD2, and the data driver DD, respectively may extend in the second direction crossing the first direction, which is a bending direction of the flexible substrate SUB, equally to each of the first channel area CA1 to the sixth channel area CA6.

Further, the first gate electrode G1, the second gate electrode G2, the third gate electrode G3, the fourth gate electrode G4, the fifth gate electrode G5, and the sixth gate electrode G6 are arranged on the same layer and may be formed simultaneously with the gate wires GW by using one process such as photolithography forming the gate wires GW.

The first capacitor C1 serves to store the data signal supplied to the inside of the pixel PE for the data programming period and maintain the data signal for one frame, and is formed between the driving power supply line ELVDDL connected to the first power supply ELVDD and the first gate electrode G1 of the first thin film transistor T1 connected to the initial power supply line Vinit. That is, the first capacitor C1 functions as a storage capacitor.

The first capacitor C1 is arranged on the flexible substrate SUB and includes a first capacitor electrode CE1 and a second capacitor electrode CE2 which face each other with the first insulation layer CIL1 therebetween.

The first capacitor electrode CE1 is connected to the initial power supply line Vinit through the fourth thin film transistor T4, and is arranged on the same layer as the first channel area CA1, and the second channel area CA2 to the sixth channel area CA6.

The second capacitor electrode CE2 is connected to the driving power supply line ELVDDL, and is arranged on the same layer as the gate wires GW. The second capacitor electrode CE2 crosses the adjacent pixel PE to extend the second direction, as illustrated in FIG. 1.

The second capacitor C2 is formed between the first capacitor electrode CE1 of the first capacitor C1 and the second scan line SCn in order to compensate a voltage drop due to a load in the organic light emitting diode display 1000. That is, the second capacitor C2 increases voltage of the first gate electrode G1 of the first thin film transistor T1 by a coupling effect when a voltage level of a current scan signal is changed. This occurs particularly at the time when the supply of the current scan signal stops to serve as a boosting capacitor of compensating voltage drop due to a load in the organic light emitting diode display 1000.

Hereinafter, the operation of the pixel PE will be described.

First, a previous scan signal of a low level is supplied through the first scan line SCn−1 for a first period set as an initialization period. Then, the fourth thin film transistor T4 is turned on in response to the previous scan signal of the low level and the initial power supply is supplied from the initial power supply line Vinit to the first thin film transistor T1 through the fourth thin film transistor T4, and as a result, the first thin film transistor T1 is initialized.

Thereafter, a current scan signal of a low level is supplied through the second scan line SCn for a second period set as a data programming period. Then, the second thin film transistor T2 and the third thin film transistor T3 are turned on in response to the current scan signal of the low level.

In addition, since the first thin film transistor T1 is turned on in a form diode-connected by the third thin film transistor T3 and particularly, the first thin film transistor T1 is initialized for the first period, the first thin film transistor T1 is diode-connected in a forward direction.

Accordingly, the data signal supplied from the data line DAm passes through the second thin film transistor T2, the first thin film transistor T1, and the third thin film transistor T3, and as a result, voltage corresponding to a difference between the data signal and the threshold voltage of the first thin film transistor T1 is stored in the first capacitor C1.

Thereafter, when the voltage level of the current scan signal is changed to the high level while the supply of the current scan signal stops, the voltage applied to the first gate electrode G1 of the first thin film transistor T1 is changed in response to a voltage change width of the current scan signal by coupling effect of the second capacitor C2. In this case, since the voltage applied to the first gate electrode G1 of the first thin film transistor T1 is changed by charge sharing between the first capacitor C1 and the second capacitor C2, a voltage change amount applied to the first gate electrode G1 is changed in proportional to a charge sharing value between the first capacitor C1 and the second capacitor C2 in addition to the voltage change width of the current scan signal.

Thereafter, the light emission control signal supplied from the light emission control line En is changed from the high level to the low level for a third period set as the light emitting period. Then, the fifth thin film transistor T5 and the sixth thin film transistor T6 are turned on by the light emission signal of the low level for the third period. As a result, driving current is supplied to a path from the first power supply ELVDD to the second power supply ELVSS through the driving power supply line ELVDDL via the fifth thin film transistor T5, the first thin film transistor T1, the sixth thin film transistor T6, and the organic light emitting diode OLED.

The driving current is controlled by the first thin film transistor T1, and the first thin film transistor T1 generates driving current having a magnitude corresponding to the voltage supplied to the first gate electrode G1 of the first thin film transistor T1. In this case, since the voltage reflected with the threshold voltage of the first thin film transistor T1 is stored in the first capacitor C1 for the second period, the threshold voltage of the first transistor T1 is compensated for the third period.

As such, in the organic light emitting diode display 1000 according to the first exemplary embodiment, the first channel area CA1 to the sixth channel area CA6 included in the first thin film transistor T1 to the sixth thin film transistor T6 respectively extend in the second direction crossing the first direction, which is the bending direction of the flexible substrate SUB, respectively. As a result, when the flexible substrate SUB is bent in the first direction, the first channel area CA1 to the sixth channel area CA6 are not bent in the second direction, which is the extending direction, respectively. As a result, even though the flexible substrate SUB is bent in the first direction and therefore stress is applied to each of the first thin film transistor T1 to the sixth thin film transistor T6 arranged on the flexible substrate SUB, the stress applied to each of the first thin film transistor T1 to the sixth thin film transistor T6 is minimized and therefore does not largely influence the current flowing through the first channel area CA1 to the sixth channel area CA6.

Further, in the organic light emitting diode display 1000 according to the first exemplary embodiment, the channel areas of the thin film transistors included in the gate driver GD1, the light emission control driver GD2, and the data driver DD, extend in the second direction crossing the first direction, which is the bending direction of the flexible substrate SUB equally to the first channel area CA1 to the sixth channel area CA6. As a result, even though the flexible substrate SUB is bent in the first direction and stress is applied to each of the gate driver GD1, the light emission control driver GD2, and the data driver DD arranged on the flexible substrate SUB, the stress applied to the channel area of the thin film transistor included in each of the gate driver GD1, the light emission control driver GD2, and the data driver DD is minimized and therefore does not largely influence the current flowing through the channel area of the thin film transistor included in each of the gate driver GD1, the light emission control driver GD2, and the data driver DD.

Further, in the organic light emitting diode display 1000 according to the first exemplary embodiment, when the flexible substrate SUB is bent in the first direction, since the entire channel area is widened in the first direction, which is a width direction of each of the first channel area CA1 to the sixth channel area CA6, mobility of the current flowing through each of the first channel area CA1 to the sixth channel area CA6 may be improved.

As a result, it is possible to provide the organic light emitting diode display 1000 capable of minimizing an electric characteristic of each of the first channel area CA1 to the sixth channel area CA6 from deteriorating, even while including the flexible substrate.

Hereinafter, an organic light emitting diode display according to a second exemplary embodiment will be described with reference to FIG. 4.

Hereinafter, the distinguishing portions different from the first exemplary embodiment are extracted and described, and omitted portions from the description follow the first exemplary embodiment. In addition, in the second exemplary embodiment, for convenience of the description, the same elements will be described by using the same reference numerals as the first exemplary embodiment.

Figure 4:
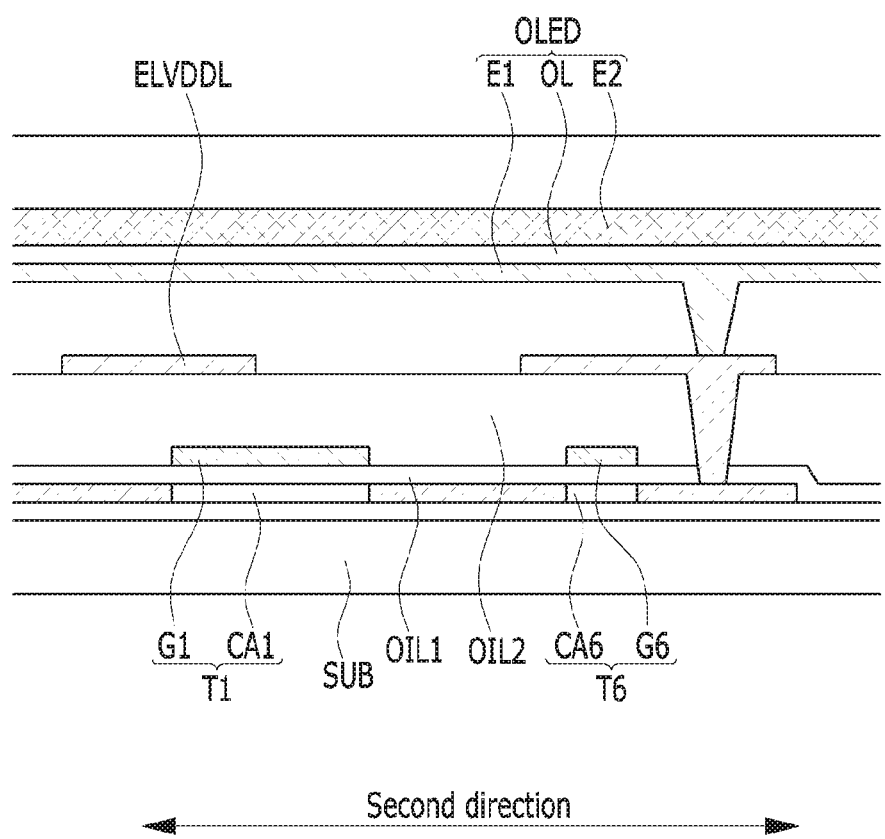
FIG. 4 is a cross-sectional view illustrating a part of a pixel part of an organic light emitting diode display according to a second exemplary embodiment.

Turning now to FIG. 4, FIG. 4 is a cross-sectional view illustrating a part of a pixel part of an organic light emitting diode display according to a second exemplary embodiment. As illustrated in FIG. 4, an organic light emitting diode display 1002 according to the second exemplary embodiment includes a first organic insulation layer OIL1 and a second organic insulation layer OIL2.

The first organic insulation layer OIL1 is arranged between the first gate electrode G1 and the first channel area CA1. That is, the first organic insulation layer OIL1 covers the first channel area CA1 to the sixth channel area CA6. The first organic insulation layer OIL1 contains an organic material including polyimide or siloxane.

The second organic insulation layer OIL2 covers the first gate electrode G1 to the sixth gate electrode G6. The second organic insulation layer OIL2 contains an organic material including polyimide or siloxane.

As such, in the organic light emitting diode display 1002 according to the second exemplary embodiment, each of the first organic insulation layer OIL1 and the second organic insulation layer OIL2 influencing the first channel area CA1 to the sixth channel area CA6 contains the organic material less receiving the stress as compared to an inorganic material. As a result, when the flexible substrate SUB is bent in the first direction, the stress applied to the first channel area CA1 to the sixth channel area CA6 is minimized. That is, it is possible to provide the organic light emitting diode display 1002 capable of minimizing deterioration of an electric characteristic of each of the first thin film transistor T1 to the sixth thin film transistor T6, even while including the flexible substrate.

Hereinafter, an organic light emitting diode display according to a third exemplary embodiment will be described with reference to FIGS. 5 and 6.

Hereinafter, the distinguishing portions different from the first exemplary embodiment are extracted and described, and omitted portions from the description follow the first exemplary embodiment. In addition, in the third exemplary embodiment, for convenience of the description, the same elements will be described by using the same reference numerals as the first exemplary embodiment.

Figure 5:
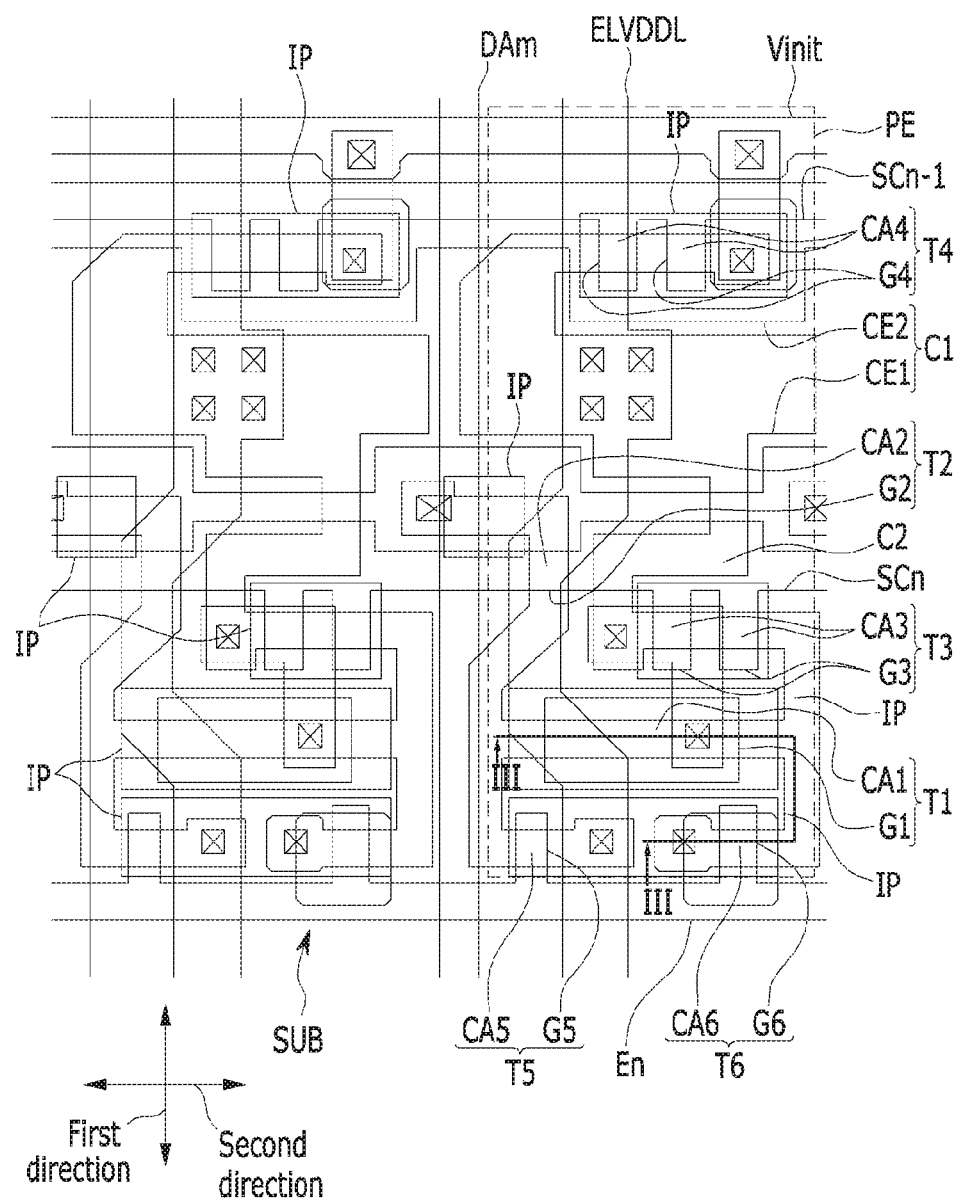
FIG. 5 is a layout view illustrating a pixel part of an organic light emitting diode display according to a third exemplary embodiment.

Turning now to FIGS. 5 and 6, FIG. 5 is a layout view illustrating a pixel part of an organic light emitting diode display according to a third exemplary embodiment and FIG. 6 is a cross-sectional view of FIG. 5 taken along line VI-VI. As illustrated in FIGS. 5 and 6, an organic light emitting diode display 1003 according to the third exemplary embodiment includes insulation patterns IP covering only the first channel area CA1 to the sixth channel area CA6, respectively. The insulation patterns IP are patterned to cover only the first channel area CA1 to the sixth channel area CA6, respectively and may contain an inorganic material or an organic material. The insulation patterns IP have island shapes on the flexible substrate SUB.

The insulation pattern IP includes a first sub-insulation pattern SIP1 and a second sub-insulation pattern SIP2. The first sub-insulation pattern SIP1 is arranged between the first gate electrode G1 and the first channel area CA1. That is, the first sub-insulation pattern SIP1 covers only the first channel area CA1 to the sixth channel area CA6, respectively. The second sub-insulation pattern SIP2 is arranged only on each of the first gate electrode G1 to the sixth gate electrode G6 and covers only the first gate electrode G1 to the sixth gate electrode G6, respectively.

As described above, in the organic light emitting diode display 1003 according to the third exemplary embodiment, the insulation patterns IP influencing the first channel area CA1 to the sixth channel area CA6 cover only the first channel area CA1 to the sixth channel area CA6 to have island shapes. As a result, when the flexible substrate SUB is bent in the first direction, the stress applied to the first channel area CA1 to the sixth channel area CA6 is minimized. That is, the insulation patterns IP covering the first channel area CA1 to the sixth channel area CA6 and the first gate electrode G1 to the sixth gate electrode G6, respectively are not formed all over the entire flexible substrate SUB, but formed in the island shapes. As a result, the stress generated when the flexible substrate SUB is bent is minimized from being applied to the first channel area CA1 to the sixth channel area CA6.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 1000 OLED display, | PE pixel |
| SUB flexible substrate, | SC1-SCn-1 first scan lines |
| SC2-SCn second scan lines, | GW gate wire, |
| DW data wire, | DA1-Dam data line, |
| E1 to En light emission control line, | PE pixel DD data line, |
| GD1 gate driver, | GD2 light emission control driver, |
| CE1 first capacitor electrode, | CE2 second capacitor electrode, |
| ELVDD first power supply, | ELVSS second power supply, |
| ELVDDL driving power supply line, | E1 first electrode |
| E2 second electrode, | OL organic emission layer |
| CA1 to CA6 first to sixth channel areas | G1 to G6 first to sixth gate electrodes, |
| IP insulation patterns, | SIP1 to SIP6 sub-insulation patterns, |
| CIL1 to CIL2 first to sixth inorganic insulation layers, | |
| OIL1 to OIL6 first to sixth organic insulating patterns | |

What is claimed is:

1. An organic light emitting diode (OLED) display device, comprising:

a flexible substrate bent in a first direction and having a pixel region;

an organic light emitting diode of a pixel in the pixel region arranged on the flexible substrate;

a driving thin film transistor connected to the organic light emitting diode and including a driving channel area extending in a second direction that crosses the first direction;

at least one additional thin film transistor comprising a semiconducting layer connected to a semiconductor layer of the driving thin film transistor and at least one additional channel area extending in the second direction; and an organic insulation layer covering a first gate electrode, wherein the at least one additional thin film transistor is a switching thin film transistor of the pixel in the pixel region.

2. The OLED display device of claim 1, wherein:
the flexible substrate has a rectangular shape, and
the first direction is a parallel direction to a long side of the flexible substrate.

3. The OLED display device of claim 1, the organic insulation layer covering the driving channel area and the at least one additional channel area, respectively.

4. The OLED display device of claim 3, the organic insulation layers having an island shape.

5. The OLED display device of claim 1, further comprising:
a first scan line extending in the second direction on the flexible substrate;
a second scan line spaced apart from the first scan line and extending in the second direction;
an initial power supply line spaced apart from the second scan line and extending in the second direction;
a light emission control line spaced apart from the initial power supply line and extending in the second direction;
a data line extending in the first direction on the flexible substrate; and
a driving power supply line spaced apart from the data line and extending in the first direction.

6. The OLED display device of claim 5, wherein:
the at least one additional thin film transistor includes a plurality of additional thin film transistors,
the driving thin film transistor includes the first gate electrode arranged on the driving channel area,
the plurality of additional thin film transistors include:

a second thin film transistor including a second gate electrode connected to the first scan line and a second channel area connecting the data line to the driving channel area and extending in the second direction;

a third thin film transistor including a third gate electrode connected to the first scan line and a third channel area connecting the driving channel area to the first gate electrode of the driving thin film transistor and extending in the second direction;

a fourth thin film transistor including a fourth gate electrode connected to the second scan line and a fourth channel area connecting the initial power supply line to the first gate electrode and extending in the second direction;

a fifth thin film transistor including a fifth gate electrode connected to the light emission control line and a fifth channel area connecting the driving power supply line to the driving channel area and extending in the second direction; and a sixth thin film transistor including a sixth gate electrode connected to the light emission control line and a sixth channel area connecting the driving channel area to the organic light emitting diode and extending in the second direction.

7. The OLED display device of claim 1, wherein:
the OLED includes a first electrode connected to the driving thin film transistor;
an organic emission layer arranged on the first electrode; and
a second electrode arranged on the organic emission layer, wherein the organic insulation layer is arranged between the OLED and the flexible substrate.

8. The OLED display device of claim 1, the second direction being orthogonal to the first direction.

9. The OLED display device of claim 1, the flexible substrate being comprised of polyimide.

10. The OLED display device of claim 1, the first direction being a longitudinal direction of the flexible substrate, when the flexible substrate is bent in the first direction, a bending line extending along the second direction of the flexible substrate and being parallel to a lengthwise direction of each of the driving channel area and the at least one additional channel areas.

11. The OLED display device of claim 10, the second direction is orthogonal to the first direction.

* * * * *